United States Patent
Kwon et al.

(10) Patent No.: US 12,170,188 B2
(45) Date of Patent: Dec. 17, 2024

(54) SUBSTRATE PROCESSING APPARATUS AND INTERLOCK METHOD THEREOF

(71) Applicant: JUSUNG ENGINEERING CO., LTD., Gwangju-si (KR)

(72) Inventors: Sang Kyo Kwon, Gwangju-si (KR); Jae Wan Lee, Gwangju-si (KR)

(73) Assignee: JUSUNG ENGINEERING CO., LTD. (KR)

(*) Notice: Subject to any disclaimer, the term of this patent is extended or adjusted under 35 U.S.C. 154(b) by 352 days.

(21) Appl. No.: 17/627,642

(22) PCT Filed: Jun. 11, 2020

(86) PCT No.: PCT/KR2020/007616
§ 371 (c)(1),
(2) Date: Jan. 14, 2022

(87) PCT Pub. No.: WO2021/020723
PCT Pub. Date: Feb. 4, 2021

(65) Prior Publication Data
US 2022/0262602 A1 Aug. 18, 2022

(30) Foreign Application Priority Data
Jul. 26, 2019 (KR) .................. 10-2019-0090628
May 20, 2020 (KR) .................. 10-2020-0060520

(51) Int. Cl.
*H01J 37/00* (2006.01)
*H01J 37/32* (2006.01)

(52) U.S. Cl.
CPC ........ *H01J 37/32477* (2013.01); *H01J 37/32* (2013.01); *H01J 37/32174* (2013.01);
(Continued)

(58) Field of Classification Search
CPC ... H01J 2237/24578; H01J 2237/24564; H01J 37/32174; H01J 37/32522; H01J 37/32
See application file for complete search history.

(56) References Cited

U.S. PATENT DOCUMENTS

| | | | | |
|---|---|---|---|---|
| 5,314,603 | A * | 5/1994 | Sugiyama | ......... H01J 37/32935 156/345.47 |
| 2009/0044752 | A1 * | 2/2009 | Furuya | ............. H01J 37/32091 118/723 E |

(Continued)

FOREIGN PATENT DOCUMENTS

| | | |
|---|---|---|
| JP | 2001244206 A | 9/2001 |
| JP | 2003282545 A | 10/2003 |

(Continued)

OTHER PUBLICATIONS

International Search Report for PCT/KR2020/007616 mailed Oct. 5, 2020.

*Primary Examiner* — Tuan T Lam
(74) *Attorney, Agent, or Firm* — Renaissance IP Law Group LLP

(57) ABSTRACT

Disclosed herein are a substrate processing apparatus and an interlock method thereof, which can generate an interlock signal, when the temperature of each upper or lower electrode in a process chamber exceeds a range set by a user, thereby cutting off application of RF power to the substrate processing apparatus. According to the substrate processing apparatus and the interlock method thereof, in an emergency where the temperatures of the upper and lower electrodes, a difference therebetween, an inter-electrode distance, and the resistance value of each electrode are out of the respective ranges set by the user, an interlock signal and an alarm signal can be generated to cut off the application of RF power to the substrate processing apparatus. Thus, it is possible to protect equipment by preventing the equipment from being dam- (Continued)

aged by RF power and to maintain the uniformity of a thin film deposited on a substrate.

7 Claims, 6 Drawing Sheets

(52) U.S. Cl.
CPC .. *H01J 37/32522* (2013.01); *H01J 37/32568* (2013.01); *H01J 2237/24564* (2013.01); *H01J 2237/24578* (2013.01); *H01J 2237/24585* (2013.01)

(56) References Cited

U.S. PATENT DOCUMENTS

| | | | |
|---|---|---|---|
| 2015/0168962 A1 | | 6/2015 | Waldmann et al. |
| 2019/0326102 A1* | | 10/2019 | Mitsumori ........ H01L 21/67103 |
| 2019/0385815 A1* | | 12/2019 | Iwashita ........... H01J 37/32183 |
| 2020/0227270 A1* | | 7/2020 | Iwase ................ H01L 21/31116 |

FOREIGN PATENT DOCUMENTS

| | | | | |
|---|---|---|---|---|
| JP | 2006269854 A | | 10/2006 | |
| JP | 2007214176 A | | 8/2007 | |
| JP | 2019091880 A | | 6/2019 | |
| KR | 20080078342 A | * | 8/2008 | |
| KR | 20080107261 A | | 12/2008 | |
| KR | 101027183 B1 | | 4/2011 | |

\* cited by examiner

SUBSTRATE PROCESSING APPARATUS AND INTERLOCK METHOD THEREOF

BACKGROUND

1. Technical Field

The present disclosure relates to a substrate processing apparatus, and more particularly, to a substrate processing apparatus and an interlock method thereof, which can generate an interlock signal, when a temperature of each of upper and lower electrodes, a value of difference therebetween, an inter-electrode distance, or a resistance value of each electrode in a process chamber exceeds a range set by a user, thereby cutting off supply of RF power to the substrate processing apparatus.

2. Related Art

In general, thin film layers, thin film circuit patterns, and/or optical patterns are required to be formed on a substrate in order to manufacture semiconductor devices, flat panel displays, solar cells, or the like. To this end, processes, such as a deposition process of depositing on a substrate a thin film made of a specific material, a photo process of selectively exposing the thin film by means of a photosensitive material, and an etching process of selectively removing an exposed portion of the thin film to form a pattern, are performed on the substrate. In this case, a substrate processing apparatus is used to process the substrate using plasma.

FIG. 1 is a cross-sectional view illustrating a conventional substrate processing apparatus.

As illustrated in FIG. 1, the conventional substrate processing apparatus, which is designated by reference numeral 100, includes a process chamber 110 that provides a reaction space for processing a substrate(s) S, a chamber lid 120 covering the upper portion of the process chamber 110, an electrode unit 130 including a first electrode 131 as an upper electrode and a second electrode 132 as a lower electrode, a substrate support 140, and an RF power supply 150. The conventional substrate processing apparatus performs the processing of the substrate by supplying gas to the substrate through the electrode unit 130 and applying RF power through the RF power supply 150 to generate plasma.

In the electrode unit 130 of the conventional substrate processing apparatus, the first electrode 131 has a plurality of protruding electrodes 131a protruding toward the substrate, and the second electrode 132 has a plurality of second gas injection holes 132a through which the respective protruding electrodes 131a pass. The electrode unit 130 may further include an insulating means 133 that insulates the first electrode 131 and the second electrode 132 from each other.

The first electrode 131 may have a plurality of first gas injection holes 131b through which a first gas is sprayed onto the substrate S, and the second electrode 132 may have the above-mentioned second gas injection holes 132a through which a second gas is sprayed onto the substrate S.

The substrate support 140 is installed inside the process chamber 110 and supports a plurality of substrates S or a single large area substrate S.

The RF power supply 150 applies one or more powers to at least one of the first and second electrodes, thereby allowing the gas injected into the reaction space to be converted into plasma.

As the process of processing the substrate(s) proceeds in the substrate processing apparatus 100, the temperature in the process chamber increases, and the first and second electrodes 131 and 132 thermally expand due to the increasing temperature. Typically, the second electrode 132, which is close to the substrate support 140 heated by a heater 141, has a higher temperature than the first electrode 131. This difference in temperature leads to a difference in thermal expansion between the first electrode 131 and the second electrode 132. Moreover, a short circuit occurs between the first electrode 131 and the second electrode 132 when there is a large difference in thermal expansion therebetween.

Accordingly, it is necessary to maintain the temperatures of the first and second electrodes 131 and 132 within a predetermined range during the process. To this end, a heat exchanger is used to maintain the temperature of the first electrode 131 in a range of 100° C. to 120° C. to prevent thermal decomposition of the process gas supplied thereto, and to maintain the temperature of the second electrode 132 in a range of 200° C. to 220° C.

However, in an emergency where the temperatures of the first and second electrodes 131 and 132 are out of the above respective ranges during the process, a short circuit occurs between the first electrode 131 and the second electrode 132. When RF power is applied to the substrate processing apparatus in case of the short circuit between the first electrode 131 and the second electrode 132 as described above, the equipment within the substrate processing apparatus 100 may be damaged by the RF power.

In addition, when the temperatures of the first and second electrodes 131 and 132 are out of the above respective ranges during the process to incur a large difference in thermal expansion between the first electrode 131 and the second electrode 132, an unnecessary reaction may occur between the first gas and the second gas due to the injection of the first and second gases in close proximity to each other. For this reason, it may be impossible to maintain the uniformity of the thin film deposited on the substrate.

SUMMARY

Various embodiments are directed to a substrate processing apparatus and an interlock method thereof, which can generate an interlock signal when a temperature of each of upper and lower electrodes, a value of difference therebetween, an inter-electrode distance, or a resistance value of each electrode in a process chamber exceeds a range set by a user, in order to cut off application of RF power to the substrate processing apparatus, thereby protecting equipment thereof by preventing the equipment from being damaged by the RF power and maintaining uniformity of a thin film deposited on a substrate.

In an embodiment, there is provided a substrate processing apparatus that includes a process chamber configured to provide a reaction space for processing a substrate, a first electrode installed in the process chamber to face the substrate, a second electrode positioned beneath the first electrode, a substrate support installed opposite to the first or second electrode and configured to support the substrate, and an RF power supply configured to supply at least one RF power to at least one of the first and second electrodes, wherein when a temperature of the first or second electrode is out of each set range or a temperature of the first electrode or the substrate support is out of each set range, the supply of the RF power is stopped.

In another embodiment, there is provided a substrate processing apparatus that includes a process chamber configured to provide a reaction space for processing a substrate, a first electrode installed in the process chamber to face the substrate, a second electrode positioned beneath the first electrode, a substrate support installed opposite to the first or second electrode and configured to support the substrate, and an RF power supply configured to supply at least one RF power to at least one of the first and second electrodes, wherein when a value of difference between temperatures of the first and second electrodes is out of a first set range or a value of difference between temperatures of the first electrode and the substrate support is out of a second set range, the supply of the RF power is stopped.

In still another embodiment, there is provided a substrate processing apparatus that includes a process chamber configured to provide a reaction space for processing a substrate, a first electrode installed in the process chamber to face the substrate, a second electrode positioned beneath the first electrode, a substrate support installed opposite to the first or second electrode and configured to support the substrate, and an RF power supply configured to supply at least one RF power to at least one of the first and second electrodes, wherein when a resistance value of the first or second electrode is out of a set range, the supply of the RF power is stopped.

In yet another embodiment, there is provided a substrate processing apparatus that includes a process chamber configured to provide a reaction space for processing a substrate, a first electrode installed in the process chamber to face the substrate, a second electrode positioned beneath the first electrode, a substrate support installed opposite to the first or second electrode and configured to support the substrate, and an RF power supply configured to supply at least one RF power to at least one of the first and second electrodes, wherein when an inter-electrode distance between the first electrode and the second electrode is out of a set range, the supply of the RF power is stopped.

In a further embodiment, there is provided an interlock method of a substrate processing apparatus, which includes measuring a temperature of a first electrode and a temperature of at least one of a second electrode and a substrate support, comparing the temperature of the first or second electrode with each set range or comparing the temperature of the first electrode or the substrate support with each set range, generating an interlock signal according to the result of comparison, and cutting off supply of RF power in response to the interlock signal.

In another further embodiment, there is provided an interlock method of a substrate processing apparatus, which includes measuring a temperature of a first electrode and a temperature of at least one of a second electrode and a substrate support, comparing a value of difference between the temperatures of the first and second electrodes with a first set range or comparing a value of difference between the temperatures of the first electrode and the substrate support with a second set range, generating an interlock signal according to the result of comparison, and cutting off supply of RF power in response to the interlock signal.

In still another further embodiment, there is provided an interlock method of a substrate processing apparatus, which includes measuring an inter-electrode distance between a first electrode and a second electrode, determining whether the inter-electrode distance is within a set range, generating an interlock signal according to the result of determination, and cutting off supply of RF power in response to the interlock signal.

In yet another further embodiment, there is provided an interlock method of a substrate processing apparatus, which includes measuring a resistance value of a first electrode or a second electrode, comparing the resistance value of the first or second electrode with a set range and determining whether the resistance value of the first or second electrode is within the set range, generating an interlock signal according to the result of comparison, and cutting off supply of RF power in response to the interlock signal.

DETAILED DESCRIPTION

Figure 1:
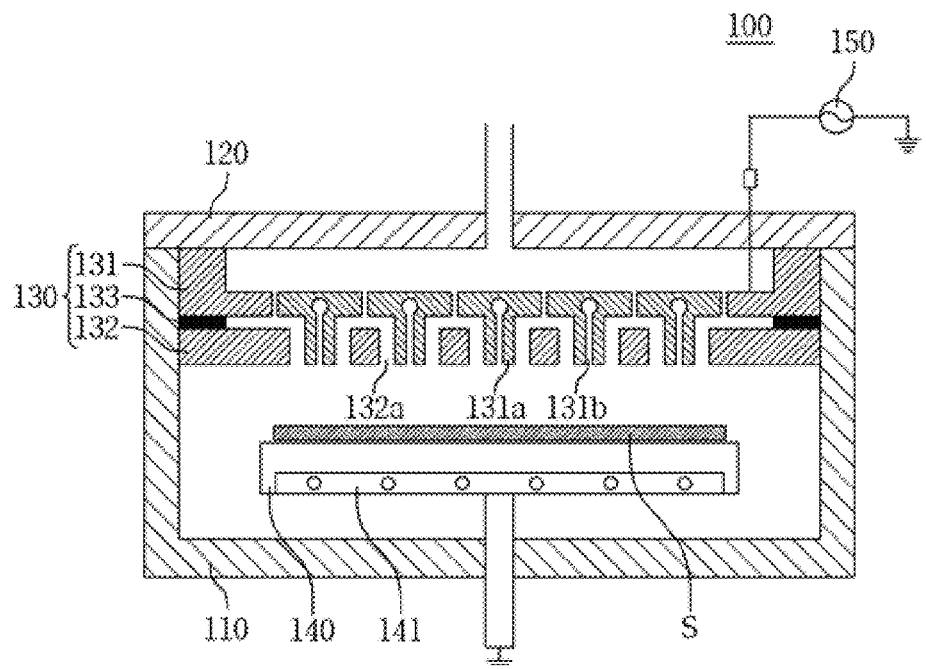
FIG. 1 is a cross-sectional view illustrating a conventional substrate processing apparatus.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

Figure 2:
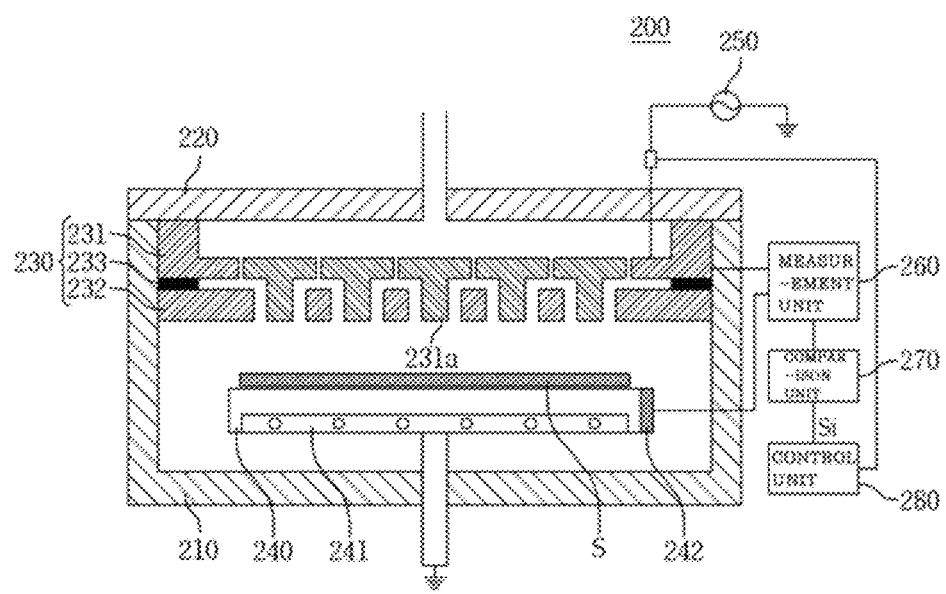
FIG. 2 is a cross-sectional view illustrating a substrate processing apparatus according to an embodiment of the present disclosure.

FIG. 2 is a cross-sectional view illustrating a substrate processing apparatus according to an embodiment of the present disclosure.

As illustrated in FIG. 2, the substrate processing apparatus, which is designated by reference numeral 200, according to the embodiment of the present disclosure may include a process chamber 210 that provides a reaction space for processing a substrate(s) S, a chamber lid 220 covering the upper portion of the process chamber 210, an electrode unit 230 including a first electrode 231 as an upper electrode and a second electrode 232 as a lower electrode, a substrate support 240, and an RF power supply 250. The substrate processing apparatus 200 may perform the processing of the substrate by supplying process gas to the substrate through the electrode unit 230 and applying RF power through the RF power supply 250 to generate plasma.

In the electrode unit 230 of the substrate processing apparatus 200, the first electrode 231 has a plurality of protruding electrodes 231a protruding toward the substrate, and the protruding electrodes 231a pass through the second electrode 232. The electrode unit 230 may further include an insulating means 233 that insulates the first electrode 231 and the second electrode 232 from each other.

The substrate support 240 is installed inside the process chamber 210 and supports a plurality of substrates S or a single large area substrate S. The RF power supply 250 supplies one or more powers to at least one of the first and second electrodes 231 and 232, thereby allowing the gas injected into the reaction space to be converted into plasma.

In general, the uniformity of the thin film deposited on the substrate in the substrate processing apparatus is affected by the change in process parameters such as the temperatures of the electrode unit and the substrate support. When the substrate processing apparatus starts to operate at the beginning of the process, it may take a long time to stabilize the temperature of the electrode unit. The electrode unit may be heated by radiation from the substrate, and may be deprived of some heat by the process gas flowing therethrough. This change in temperature causes the uniformity of the thin film deposited on the substrate to decrease.

Therefore, it is preferable to connect a heat exchanger (not shown) to the electrode unit 230 so that the temperature of the electrode unit 230 is able to be kept constant even during the process. In this case, the temperature of the first electrode 231 of the electrode unit 230 is preferably maintained in a range of 100° C. to 120° C.

On the other hand, since the second electrode 232 is positioned close to the substrate support 240 heated by a heater 241, the second electrode 232 has a higher temperature than the first electrode 231. The temperature of the second electrode 232 is preferably maintained in a range of 200° C. to 220° C. Although the temperature of the second electrode 232 has been described as being indirectly measured through the temperature of the substrate support 240 in the embodiment of the present disclosure, in some cases, the temperature of the second electrode 232 may be directly measured by a temperature measuring means.

The substrate support 240 is disposed opposite to the electrode unit 230 in a lower portion within the process chamber 210 and supports the substrate S.

Since the thin film formed on the substrate varies greatly with the temperature of the substrate, it is important to keep the temperature of the substrate uniform. In the embodiment of the present disclosure, the heater 241 may be provided in the lower portion of the substrate support 240 to heat the substrate support 240, thereby heating the substrate S by means of the heated substrate support 240. In addition, in order to keep the temperature of the substrate constant at every process, the substrate support 240 may be provided with a temperature measuring means 242, such as a thermocouple, which measures the temperature of the substrate support 240, thereby enabling the temperature of the substrate support 240 to be kept constant.

In this case, the temperature of the substrate support 240 is preferably set to and maintained in a range of 350° C. to 380° C. in order to properly process the substrate.

The RF power supply 250 may supply RF power to at least one of the first and second electrodes 231 and 232 to generate plasma between the first electrode 231 and the second electrode 232.

Although FIG. 2 illustrates an example in which the RF power supply 250 is connected to the first electrode 231, the RF power supply 250 may be connected to the second electrode 232. Alternatively, the RF power supply 250 may apply different RF power voltages to the first and second electrodes 231 and 232 while being connected to both the first and second electrodes 231 and 232.

Meanwhile, the substrate processing apparatus 200 according to the embodiment of the present disclosure may further include a measurement unit 260, a comparison unit 270, and a control unit 280.

The measurement unit 260 may measure a temperature of the first electrode 231 of the electrode unit 230 and a temperature of at least one of the second electrode 232 and the substrate support 240. The temperature of the first electrode 231 of the electrode unit 230 may be measured based on the temperature of the heat exchanger (not shown) connected to the first electrode 231, and the temperature of the substrate support may be measured based on the temperature of the thermocouple connected to the substrate support. The temperature of the second electrode may be measured indirectly through the temperature of the substrate support, or may be measured directly by the temperature measuring means.

The comparison unit 270 may compare the temperatures of the first or second electrodes 231 or 232, which are transferred from the measurement unit 260, with each set range or may compare the temperatures of the first electrode 231 or the substrate support 240, which are transferred from the measurement unit 260, with each set range. When the above temperatures are out of the each set range, the comparison unit 270 may generate and transmit an interlock signal Si for stopping supply of RF power to the control unit.

In this case, it is preferable that the set range of the first electrode 231 be 100° C. to 120° C., the set range of the second electrode 232 be 200° C. to 220° C., and the set range of the substrate support 240 be 350° C. to 380° C.

On the other hand, the comparison unit 270 may determine whether the temperatures of the first or second electrodes 231 or 232 or the temperatures of the first electrode 231 or the substrate support 240, which are transferred from the measurement unit 260, is within each set range, based on first to third criteria, to determine whether to generate an interlock signal Si.

The first criterion means that the temperature of the first electrode 231 and the temperature of at least one of the second electrode 232 and the substrate support 240 are a room temperature of 50° C. or less. When the temperature of the first electrode 231 and the temperature of at least one of the second electrode 232 and the substrate support 240 are the room temperature of 50° C. or less as described above, it may be determined that the process is in an initial state before starting. Thus, there is no concern that the in-apparatus equipment is damaged by RF power even if the RF power is supplied to the first electrode 231. Therefore, the comparison unit 270 does not generate the interlock signal Si when the first criterion is satisfied.

The second criterion means that the temperature of the first or second electrode 231 or 232 is within each set range. In this case, the set range of the first electrode 231 is 100° C. to 120° C., and the set range of the second electrode 232 is 200° C. to 220° C.

The third criterion means that the temperature of the first electrode 231 or the temperature of the substrate support 240 is within each set range. In this case, the set range of the first electrode 231 is 100° C. to 120° C., and the set range of the substrate support is 350° C. to 380° C.

Satisfying the second and third criteria means that the process is in a normal state in progress. When the temperature of the first or second electrode 231 or 232 is within the each set range (i.e., when the second criterion is satisfied) and when the temperature of the first electrode 231 or the substrate support 240 is within the each set range (i.e., when the third criterion is satisfied), there is no concern that the in-apparatus equipment is damaged by RF power even if the RF power is supplied to the first or second electrode 231 or 232. Therefore, the comparison unit 270 does not generate the interlock signal Si when both the second and third criteria are satisfied.

That is, the comparison unit 270 does not generate the interlock signal Si when the first criterion is satisfied (i.e., the process being in an initial state) and when both the second and third criteria are satisfied (i.e., the process being in a normal state in progress).

However, while the process is normally performed, when the second criterion is not satisfied because the temperature of the first or second electrode 231 or 232 is out of the each set range or when the third criterion is not satisfied because the temperature of the first electrode 231 or the substrate support 240 is out of the each set range, it is determined that an emergency occurs. Thus, the comparison unit 270 generates and transmits the interlock signal Si to the control unit 280.

Meanwhile, in case of an emergency such as when the second or third criterion is not satisfied, the comparison unit 270 may generate an alarm signal such as a warning sound or an emergency light flashing to allow a user to manually stop the supply of RF power, in addition to generating and transmitting the interlock signal Si to the control unit 280.

When the control unit 280 receives the generated interlock signal Si from the comparison unit 270, the control unit 280 may cut off the RF power supplied from the RF power supply 250 to the first or second electrode 231 or 232.

The above embodiment has been described in which the comparison unit 270 generates and transmits the interlock signal Si for stopping supply of RF power to the control unit when the temperature of the first or second electrode 231 or 232, which are transferred from the measurement unit 260, is out of the each set range by comparing them or when the temperature of the first electrode 231 or the substrate support 240, which are transferred from the measurement unit 260, is out of the each set range by comparing them.

Hereinafter, another example will be described in which a comparison unit 270 generates and transmits an interlock signal Si for stopping supply of RF power to a control unit when a value of difference between the temperatures of the first and second electrodes 231 and 232, which are transferred from a measurement unit 260, is out of a first set range by comparing them or when a value of difference between the temperatures of the first electrode 231 and the substrate support 240, which are transferred from the measurement unit 260, is out of a second set range by comparing them.

As illustrated in FIG. 2, a substrate processing apparatus 200 according to another example of the embodiment of the present disclosure may have the same configuration as that according to the above-mentioned embodiment, except for including a measurement unit 260, a comparison unit 270, and a control unit 280, which are different from those in the above-mentioned embodiment.

The measurement unit 260 may measure a temperature of the first electrode 231 and a temperature of at least one of the second electrode 232 and the substrate support 240. The temperature of the first electrode 231 may be measured based on the temperature of the heat exchanger (not shown) connected to the first electrode 231. The temperature of the substrate support 240 may be measured based on the temperature of the temperature measuring means 242, such as the thermocouple, connected to the substrate support 240. The temperature of the second electrode 232 may be measured indirectly through the temperature of the substrate support 240, or may be measured directly by the temperature measuring means.

The comparison unit 270 may compare a value of difference between the temperatures of the first and second electrodes 231 and 232, which are transferred from the measurement unit 260, with a first set range or may compare a value of difference between the temperatures of the first electrode 231 and the substrate support 240, which are transferred from the measurement unit 260, with a second set range. When the above value of difference is out of the first set range or the above value of difference is out of the second set range, the comparison unit 270 may generate and transmit an interlock signal Si for stopping supply of RF power to the control unit.

In general, while the process is performed, the temperature of the first electrode 231 is maintained in the range of 100° C. to 120° C., the temperature of the second electrode 232 is maintained in the range of 200° C. to 220° C., and the temperature of the substrate support 240 is maintained in the range of 350° C. to 380° C. Therefore, it is preferable that the first set range for the difference between the temperatures of the first and second electrodes 231 and 232 be 80° C. to 120° C., and the second set range for the difference between the temperatures of the first electrode 231 and the substrate support 240 be 230° C. to 280° C.

In this case, the comparison unit 270 may determine whether the value of difference between the temperatures of the first and second electrodes 231 and 232, which are transferred from the measurement unit 260, is within the first set range and whether the value of difference between the temperatures of the first electrode 231 and the substrate support 240, which are transferred from the measurement unit 260, is within the second set range, based on fourth to sixth criteria, to determine whether to generate an interlock signal Si.

The fourth criterion means that the temperature of the first electrode 231 and the temperature of at least one of the second electrode 232 and the substrate support 240 are a room temperature of 50° C. or less. When the temperature of the first electrode 231 and the temperature of at least one of the second electrode 232 and the substrate support 240 are the room temperature of 50° C. or less as described above, it may be determined that the process is in an initial state before starting. Thus, there is no concern that the in-apparatus equipment is damaged by RF power even if the RF power is supplied to the first or second electrode 231 or 232. Therefore, the comparison unit 270 does not generate the interlock signal Si when the fourth criterion is satisfied.

The fifth criterion means that the value of difference between the temperatures of the first and second electrodes 231 and 232 is within the first set range, i.e., the range of 80° C. to 120° C. The sixth criterion means that the value of difference between the temperatures of the first electrodes 231 and the substrate support 240 is within the second set range, i.e., the range of 230° C. to 280° C.

Satisfying the fifth and sixth criteria means that the process is in a normal state in progress. When the value of difference between the temperatures of the first and second electrodes 231 and 232 is within the first set range (i.e., when the fifth criterion is satisfied) and when the value of difference between the temperatures of the first electrodes 231 and the substrate support 240 is within the second set range (i.e., when the sixth criterion is satisfied), there is no concern that the in-apparatus equipment is damaged by RF power even if the RF power is supplied to the first or second electrode 231 or 232. Therefore, the comparison unit 270 does not generate the interlock signal Si when the fifth and sixth criteria are satisfied.

That is, the comparison unit 270 does not generate the interlock signal Si when the fourth criterion is satisfied (i.e., the process being in an initial state) and when both the fifth and sixth criteria are satisfied (i.e., the process being in a normal state in progress).

However, while the process is normally performed, when the fifth criterion is not satisfied because the value of difference between the temperatures of the first and second electrodes 231 and 232 is out of the first set range of 80° C. to 120° C. and when the sixth criterion is not satisfied because the value of difference between the temperatures of the first electrodes 231 and the substrate support 240 is out of the second set range of 230° C. to 280° C., it is determined that an emergency occurs. Thus, the comparison unit 270 generates and transmits the interlock signal Si to the control unit 280.

Meanwhile, in case of an emergency such as when the fifth or sixth criterion is not satisfied, the comparison unit 270 may generate an alarm signal such as a warning sound or an emergency light flashing to allow a user to manually stop the supply of RF power, in addition to generating and transmitting the interlock signal Si to the control unit 280.

When the control unit 280 receives the generated interlock signal Si from the comparison unit 270, the control unit 280 may cut off the RF power supplied from the RF power supply 250 to the first or second electrode 231 or 232.

Hereinafter, a further example will be described in which a comparison unit 270 compares a resistance value of the first or second electrode 231 or 232, which is transferred from a measurement unit 260, with a set range, in which case when the above resistance value is out of the set range, the comparison unit 270 generates and transmits an interlock signal Si for stopping supply of RF power to a control unit 280.

As illustrated in FIG. 2, a substrate processing apparatus 200 according to a further example of the embodiment of the present disclosure may have the same configuration as that according to the above-mentioned embodiment, except for including a measurement unit 260, a comparison unit 270, and a control unit 280, which are different from those in the above-mentioned embodiment.

The measurement unit 260 may measure a resistance value of the first or second electrode by turning on/off a switch according to Ohm's law and Kirchhoff's law. In this case, the resistance value of the first or second electrode may be measured by an ohmmeter having a probe, or may be measured through a simple circuit including a switch, a voltmeter, and an ammeter. For example, the measurement unit 260 may measure the resistance value of the first or second electrode by contact of the probe of the ohmmeter with the first or second electrode in a state in which RF power is not supplied thereto. In this case, the measured resistance of the first or second electrode may be specifically an insulation resistance.

The comparison unit 270 may compare the resistance value of the first or second electrode 231 or 232, which is transferred from the measurement unit 260, with a set range. When the above resistance value is out of the set range, the comparison unit 270 may generate and transmit an interlock signal Si for stopping supply of RF power to the control unit 280.

In general, whether two adjacent electrodes are short-circuited to each other may be determined by measuring the resistance values of the electrodes using the ohmmeter. That is, when the resistance value of one of the two adjacent electrodes is measured as a value close to infinity of several mega-ohms (MΩ) or more, it may be determined that the two electrodes are not short-circuited to each other without being charged with electric current. On the other hand, when the resistance value of one electrode is measured as a value of several to several hundred ohms (Ω), it may be determined that the two electrodes are short-circuited to each other with being charged with electric current. Therefore, it is preferable that the set range for the resistance value of the first or second electrode be 1 mega-ohm (MΩ) to 1000 mega-ohm (MΩ).

In this case, the comparison unit 270 may determine whether the resistance value of the first electrode 231, which is transferred from the measurement unit 260, is within the set range, to determine whether to generate the interlock signal Si. That is, when the resistance value of the first or second electrode 231 or 232, which is transferred from the measurement unit 260, is out of the set range of 1 mega-ohm (MΩ) to 1000 mega-ohm (MΩ), the comparison unit 270 may generate and transmit the interlock signal Si for stopping supply of RF power to the control unit 280.

Meanwhile, in case of an emergency such as when the resistance value of the first or second electrode 231 or 232 is out of the set range, the comparison unit 270 may generate an alarm signal such as a warning sound or an emergency light flashing to allow a user to manually stop the supply of RF power, in addition to generating and transmitting the interlock signal Si to the control unit 280.

When the control unit 280 receives the generated interlock signal Si from the comparison unit 270, the control unit 280 may cut off the RF power supplied from the RF power supply 250 to the first or second electrode 231 or 232.

Figure 3:
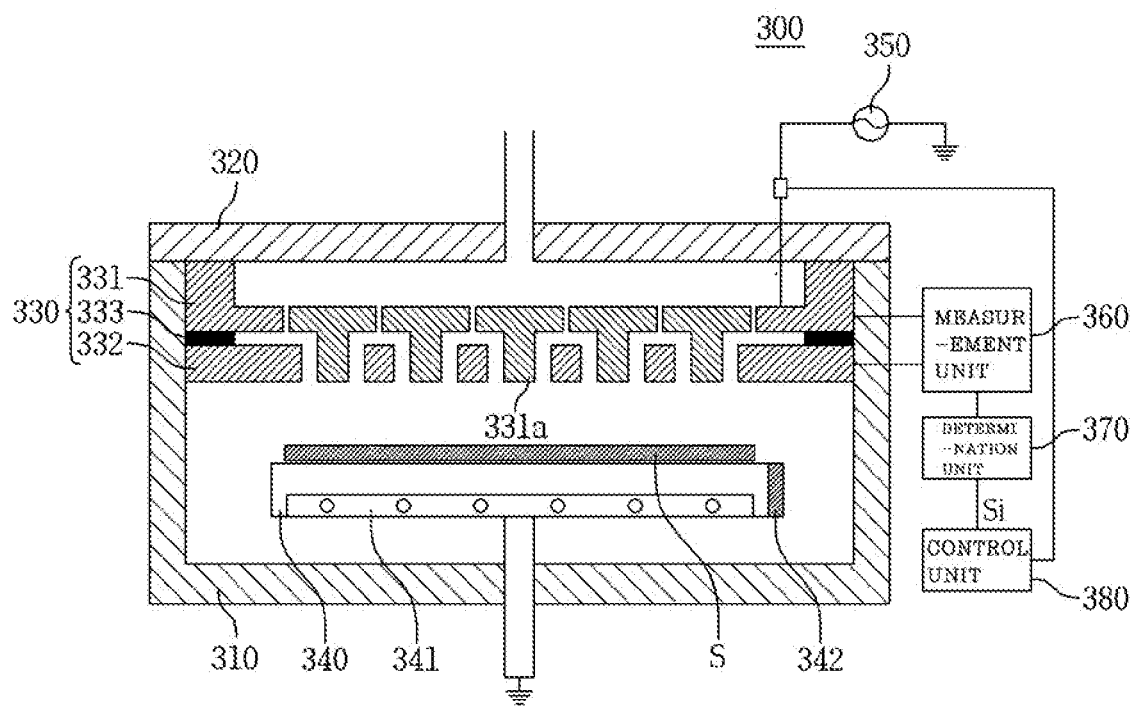
FIG. 3 is a cross-sectional view illustrating a substrate processing apparatus according to another embodiment of the present disclosure.

FIG. 3 is a cross-sectional view illustrating a substrate processing apparatus according to another embodiment of the present disclosure.

The substrate processing apparatus, which is designated by reference numeral 300, illustrated in FIG. 3 has the same configuration as the substrate processing apparatus 200 illustrated in FIG. 2, except that the measurement unit 260, the comparison unit 270, and the control unit 280 of FIG. 2 are replaced with a measurement unit 360, a determination unit 370, and a control unit 380 of FIG. 3.

The measurement unit 360 may measure a distance between the first electrode 331 and the second electrode 332. The measurement unit 360 may include a view port and a camera which are capable of observing the inside of the substrate processing apparatus, or may include a sensing means such as a distance measurement sensor provided in each of the first and second electrodes 331 and 332.

The determination unit 370 may determine whether the inter-electrode distance measured by the measurement unit 360 is within a set range and may generate an interlock signal Si when the inter-electrode distance is out of the set range. In this case, the determination unit 370 may generate the interlock signal Si by determining that the inter-electrode distance is out of the set range when the first and second electrodes 331 and 332 are in contact with each other.

When the control unit 380 receives the generated interlock signal Si from the determination unit 370, the control unit 380 may cut off the RF power supplied from the RF power supply 350 to the first or second electrode 331 or 332.

Figure 4:
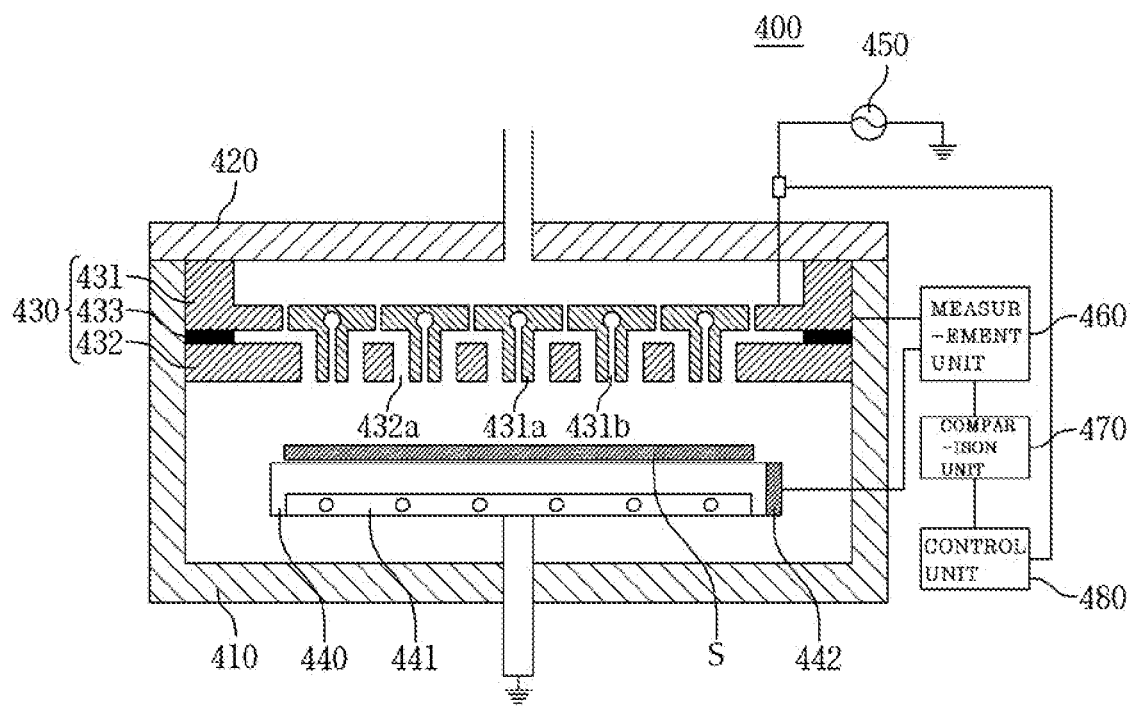
FIG. 4 is a cross-sectional view illustrating a substrate processing apparatus according to still another embodiment of the present disclosure.

FIG. 4 is a cross-sectional view illustrating a substrate processing apparatus according to still another embodiment of the present disclosure.

As illustrated in FIG. 4, the substrate processing apparatus, which is designated by reference numeral 400, according to the embodiment of the present disclosure may include a process chamber 410 that provides a reaction space for processing a substrate(s) S, a chamber lid 420 covering the upper portion of the process chamber 410, a substrate support 440, a gas injection unit 430 facing the substrate support 440 and including a first injection plate 431 and a second injection plate 432, and an RF power supply 450. The substrate processing apparatus 400 may perform the processing of the substrate by supplying process gas to the substrate through the gas injection unit 430 and applying RF power through the RF power supply 450 to generate plasma.

In the gas injection unit 430 of the substrate processing apparatus 400, the first injection plate 431 has a plurality of protruding nozzles 431a protruding toward the substrate, and the second injection plate 432 has a plurality of second gas injection holes 432a through which the respective protruding nozzles 431a pass. The gas injection unit 430 may further include an insulating means 433 that insulates the first injection plate 431 and the second injection plate 432 from each other.

The first injection plate 431 may have a plurality of first gas injection holes 431b through which a first gas is sprayed onto the substrate S, and the second injection plate 432 may have the above-mentioned second gas injection holes 432a through which a second gas is sprayed onto the substrate S.

Although FIG. 4 illustrates that the first gas injection holes 431b are formed in the protruding nozzles 431a, in some cases, the first gas injection holes 431b may be formed in a portion of the first injection plate 431, which is other than the protruding nozzles 431a without forming in the protruding nozzles 431a.

The substrate support 440 is disposed opposite to the gas injection unit 430 in a lower portion within the process chamber 410 and supports the substrate S.

The RF power supply 450 may supply RF power to at least one of the first and second injection plates 431 and 432 of the gas injection unit 430 to generate plasma.

The configuration and operation of a measurement unit 460, a comparison unit 470, and a control unit 480 illustrated in FIG. 4 are identical to those of the measurement unit 260, the comparison unit 270, and the control unit 280 illustrated in FIG. 2.

Figure 5:
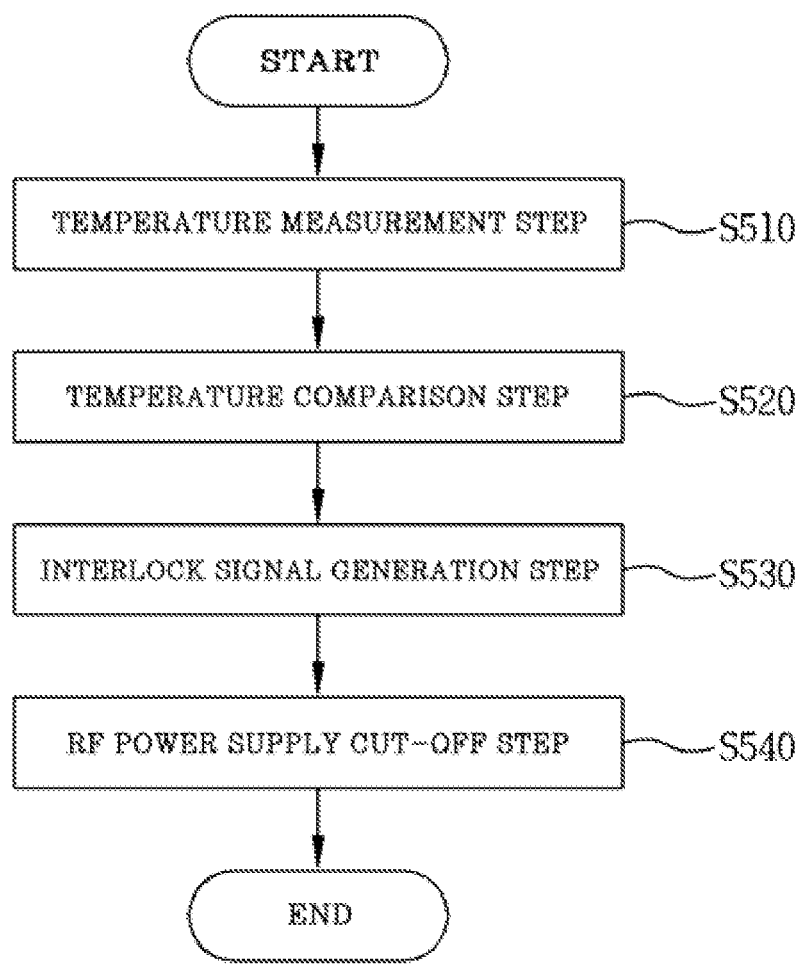
FIG. 5 is a process flowchart illustrating an interlock method of a substrate processing apparatus according to a further embodiment of the present disclosure.

FIG. 5 is a process flowchart illustrating an interlock method of a substrate processing apparatus according to a further embodiment of the present disclosure.

As illustrated in FIG. 5, the interlock method of a substrate processing apparatus according to the embodiment of the present disclosure may include a temperature measurement step S510, a temperature comparison step S520, an interlock signal generation step S530, and an RF power supply cut-off step S540.

In a substrate processing apparatus that includes a process chamber, an electrode unit including a first electrode as an upper electrode and a second electrode as a lower electrode, a substrate support, and an RF power supply, the temperature measurement step S510 may measure a temperature of the first electrode and a temperature of at least one of the second electrode and the substrate support. The temperature of the first electrode may be measured based on the temperature of a heat exchanger connected to the first electrode, and the temperature of the substrate support may be measured based on the temperature of a thermocouple connected to the substrate support. The temperature of the second electrode may be measured indirectly through the temperature of the substrate support, or may be measured directly by a temperature measuring means.

The temperature comparison step S520 may compare the temperature of the first or second electrode with each set range or may compare the temperature of the first electrode or the substrate support with each set range. In this case, it is preferable that the set range of the first electrode be 100° C. to 120° C., the set range of the second electrode be 200° C. to 220° C., and the set range of the substrate support be 350° C. to 380° C.

The interlock signal generation step S530 may generate an interlock signal by recognizing as an emergency when the result of comparison indicates that the temperature of the first or second electrode is out of the each set range or the temperature of the first electrode or the substrate support is out of the each set range.

The RF power supply cut-off step S540 may cut off the supply of RF power to the substrate processing apparatus in response to the interlock signal, thereby preventing the in-apparatus equipment from being damaged by the RF power.

Figure 6:
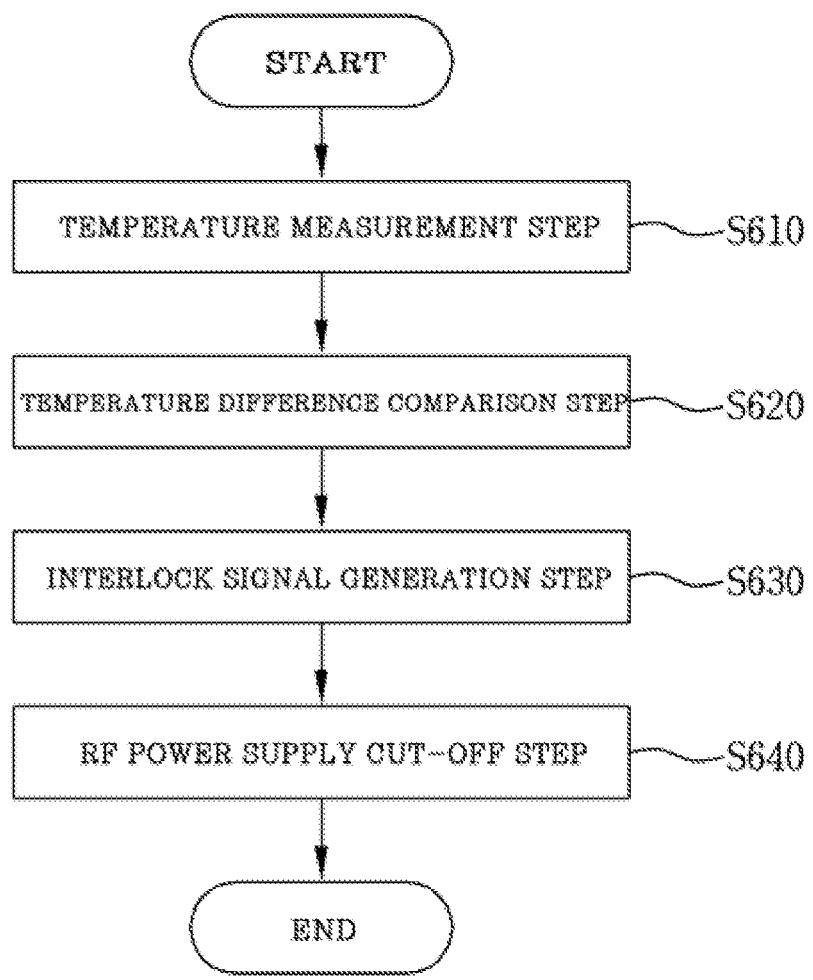
FIG. 6 is a process flowchart illustrating an interlock method of a substrate processing apparatus according to another further embodiment of the present disclosure.

FIG. 6 is a process flowchart illustrating an interlock method of a substrate processing apparatus according to another further embodiment of the present disclosure.

As illustrated in FIG. 6, the interlock method of a substrate processing apparatus according to the embodiment of the present disclosure may include a temperature measurement step S610, a temperature difference comparison step S620, an interlock signal generation step S630, and an RF power supply cut-off step S640.

In a substrate processing apparatus that includes a process chamber, an electrode unit including a first electrode as an upper electrode and a second electrode as a lower electrode, a substrate support, and an RF power supply, the temperature measurement step S610 may measure a temperature of the first electrode and a temperature of at least one of the second electrode and the substrate support. The temperature of the first electrode may be measured based on the temperature of a heat exchanger connected to the first electrode, and the temperature of the substrate support may be measured based on the temperature of a thermocouple connected to the substrate support. The temperature of the second electrode may be measured indirectly through the temperature of the substrate support, or may be measured directly by a temperature measuring means.

The temperature difference comparison step S620 may compare a value of difference between the temperatures of the first and second electrodes with a first set range for temperature difference or may compare a value of difference between the temperatures of the first electrode and the substrate support with a second set range for temperature difference. In this case, it is preferable that the first set range be 80° C. to 120° C., and the second set range be 230° C. to 280° C.

The interlock signal generation step S630 may generate an interlock signal by recognizing as an emergency when the result of comparison indicates that the value of difference between the temperatures of the first and second electrodes is out of the first set range or the value of difference between the temperatures of the first electrode and the substrate support is out of the second set range.

The RF power supply cut-off step S640 may cut off the supply of RF power to the substrate processing apparatus in response to the interlock signal, thereby preventing the in-apparatus equipment from being damaged by the RF power.

Figure 7:
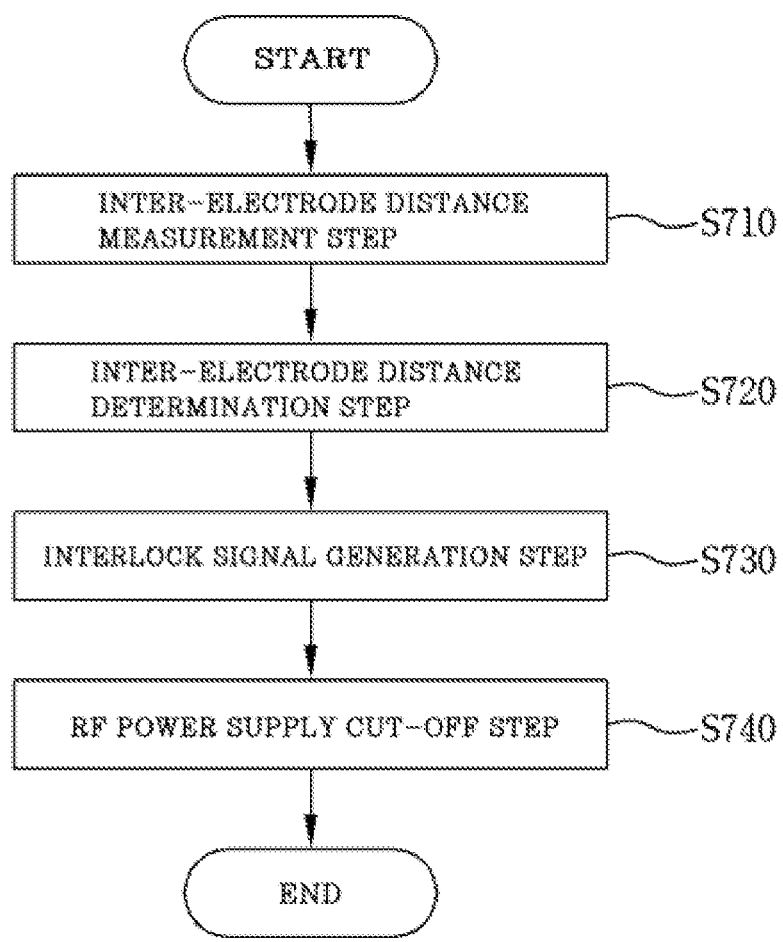
FIG. 7 is a process flowchart illustrating an interlock method of a substrate processing apparatus according to still another further embodiment of the present disclosure.

FIG. 7 is a process flowchart illustrating an interlock method of a substrate processing apparatus according to still another further embodiment of the present disclosure.

As illustrated in FIG. 7, the interlock method of a substrate processing apparatus according to the embodiment of the present disclosure may include an inter-electrode distance measurement step S710, an inter-electrode distance determination step S720, an interlock signal generation step S730, and an RF power supply cut-off step S740.

In a substrate processing apparatus that includes a process chamber, an electrode unit including a first electrode as an upper electrode and a second electrode as a lower electrode, a substrate support, and an RF power supply, the inter-electrode distance measurement step S710 may measure a distance between the first electrode and the second electrode. In this case, the distance between the first electrode and the second electrode refers to the shortest distance between each protruding electrode of the first electrode and the second electrode when the process is in an initial state or after the process is performed so that the first and second electrodes have been thermally expand.

The inter-electrode distance determination step S720 may determine whether the distance between the first electrode and the second electrode is within a set range. In this case, it is preferable that the set range be a range in which the first and second electrodes are not in contact with each other.

The interlock signal generation step S730 may generate an interlock signal by recognizing as an emergency when it is determined that the inter-electrode distance is out of the set range due to the contact between the first electrode and the second electrode.

The RF power supply cut-off step S740 may cut off the supply of RF power to the substrate processing apparatus in response to the interlock signal, thereby preventing the in-apparatus equipment from being damaged by the RF power.

Figure 8:
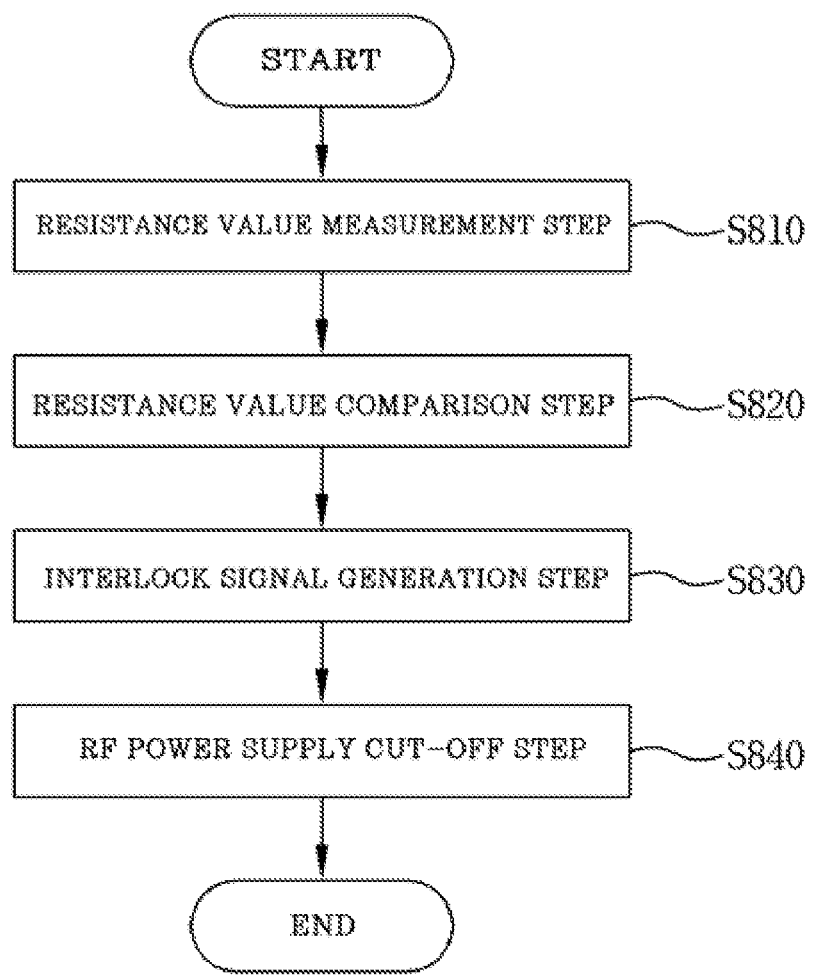
FIG. 8 is a process flowchart illustrating an interlock method of a substrate processing apparatus according to yet another further embodiment of the present disclosure.

FIG. 8 is a process flowchart illustrating an interlock method of a substrate processing apparatus according to yet another further embodiment of the present disclosure.

As illustrated in FIG. 8, the interlock method of a substrate processing apparatus according to the embodiment of the present disclosure may include a resistance value measurement step S810, a resistance value comparison step S820, an interlock signal generation step S830, and an RF power supply cut-off step S840.

In a substrate processing apparatus that includes a process chamber, an electrode unit including a first electrode and a second electrode, a substrate support, and an RF power supply, the resistance value measurement step S810 may measure a resistance value of the first or second electrode using an ohmmeter. That is, the resistance value of the first or second electrode may be measured by contact of a probe of the ohmmeter with the first or second electrode in a state in which RF power is not supplied thereto. In this case, the measured resistance of the first or second electrode may be specifically an insulation resistance of the first or second electrode.

The resistance value comparison step S820 may compare the measured resistance value of the first or second electrode with a set range and determine whether the measured resistance value is within the set range. In this case, it is preferable that the set range be 1 mega-ohm (MΩ) to 1000 mega-ohm (MΩ).

The interlock signal generation step S830 may generate an interlock signal by recognizing as an emergency when it is determined that the resistance value of the first or second electrode is out of the set range.

The RF power supply cut-off step S840 may cut off the supply of RF power to the substrate processing apparatus in response to the interlock signal, thereby preventing the in-apparatus equipment from being damaged by the RF power.

As described above, the substrate processing apparatus according to the present disclosure is characterized in that, in the emergency where the temperatures of the respective first and second electrodes and substrate support, the value of difference between temperatures of the first and second electrodes or the value of difference between temperatures of the first electrode and the substrate support, the distance between the first and second electrodes, and the resistance value of the first or second electrode are out of the respective set ranges, the interlock signal or the alarm signal is generated to cut off the supply of RF power.

That is, when both the upper electrode and the lower electrode are in an initial state or within the range set by the user, RF power is allowed to be supplied thereto. Otherwise, in the emergency, the interlock signal is generated to cut off the RF power supplied to the electrode unit or the substrate support. Thus, it is possible to protect the equipment of the apparatus by preventing the equipment from being damaged by the RF power and to maintain the uniformity of the thin film deposited on the substrate.

As apparent from the above description, the substrate processing apparatus and the interlock method thereof according to the present disclosure can generate the interlock signal, when the temperature of each of the upper and lower electrodes, the value of difference therebetween, the inter-electrode distance, or the resistance value of each electrode in the process chamber exceeds the range set by the user, thereby cutting off the supply of RF power to the substrate processing apparatus. Therefore, it is possible to protect the equipment of the substrate processing apparatus by preventing the equipment from being damaged by the RF power and to maintain the uniformity of the thin film deposited on the substrate.

While various embodiments have been described above, it will be understood to those skilled in the art that the embodiments described are by way of example only. Accordingly, the disclosure described herein should not be limited based on the described embodiments.

What is claimed is:

1. A substrate processing apparatus comprising:
   a process chamber configured to provide a reaction space for processing a substrate;
   a first electrode installed in the process chamber to face the substrate;
   a second electrode positioned beneath the first electrode;
   a substrate support installed opposite to the first or second electrode and configured to support the substrate; and
   an RF power supply configured to supply at least one RF power to at least one of the first and second electrodes,
   wherein when a temperature of the first or second electrode is out of each set range or a temperature of the first electrode or the substrate support is out of each set range, the supply of the at least one RF power is stopped,
   wherein the substrate processing apparatus further comprises:
      a measurement unit configured to measure the temperature of the first electrode and the temperature of at least one of the second electrode and the substrate support;
      a comparison unit configured to generate an interlock signal when it is determined that the temperature of the first or second electrode is out of the each set range by comparing them or that the temperature of the first electrode or the substrate support is out of the each set range by comparing them; and a control unit configured to stop the supply of the at least one RF power when the interlock signal is input to the control unit, wherein the comparison unit determines whether to generate the interlock signal, based on:

a first criterion for determining whether the temperature of the first electrode and the temperature of at least one of the second electrode and the substrate support are a room temperature of 50° C. or less;

a second criterion for determining whether the temperature of the first or second electrode is within the each set range; and a third criterion for determining whether the temperature of the first electrode or the substrate support is within the each set range.

2. The substrate processing apparatus according to claim 1, wherein the comparison unit generates the interlock signal when the first criterion is not satisfied and at least one of the second and third criteria is not satisfied.

3. A substrate processing apparatus comprising:

a process chamber configured to provide a reaction space for processing a substrate;

a first electrode installed in the process chamber to face the substrate;

a second electrode positioned beneath the first electrode;

a substrate support installed opposite to the first or second electrode and configured to support the substrate; and an RF power supply configured to supply at least one RF power to at least one of the first and second electrodes, wherein when a value of difference between temperatures of the first and second electrodes is out of a first set range or a value of difference between temperatures of the first electrode and the substrate support is out of a second set range, the supply of the at least one RF power is stopped, wherein the substrate processing apparatus further comprises:

a measurement unit configured to measure the temperature of the first electrode and the temperature of at least one of the second electrode and the substrate support;

a comparison unit configured to generate an interlock signal when it is determined that the value of difference between the temperatures of the first and second electrodes is out of the first set range by comparing them or that the value of difference between the temperatures of the first electrode and the substrate support is out of the second set range by comparing them; and a control unit configured to stop the supply of the at least one RF power when the interlock signal is input to the control unit, wherein the comparison unit determines whether to generate the interlock signal, based on:

a fourth criterion for determining whether the temperature of the first electrode and the temperature of at least one of the second electrode and the substrate support are a room temperature of 50° C. or less;

a fifth criterion for determining whether the value of difference between the temperatures of the first and second electrodes is within the first set range; and a sixth criterion for determining whether the value of difference between the temperatures of the first electrode and the substrate support is within the second set range.

4. The substrate processing apparatus according to claim 3, wherein the comparison unit generates the interlock signal when the fourth criterion is not satisfied and at least one of the fifth and sixth criteria is not satisfied.

5. A substrate processing apparatus comprising:

a process chamber configured to provide a reaction space for processing a substrate;

a first electrode installed in the process chamber to face the substrate;

a second electrode positioned beneath the first electrode;

a substrate support installed opposite to the first or second electrode and configured to support the substrate; and an RF power supply configured to supply at least one RF power to at least one of the first and second electrodes, wherein when a resistance value of the first or second electrode is out of a set range, the supply of the at least one RF power is stopped, wherein the substrate processing apparatus further comprises:

a measurement unit configured to measure the resistance value of the first or second electrode;

a determination unit configured to generate an interlock signal by determining that the first and second electrodes are short-circuited to each other when the resistance value of the first or second electrode is out of the set range; and a control unit configured to stop the supply of the at least one RF power when the interlock signal is input to the control unit, wherein the determination unit generates the interlock signal by determining that the first and second electrodes are short-circuited to each other when the resistance value of the first or second electrode is out of a range of 1 mega-ohm (MΩ) to 1000 mega-ohm (MΩ).

6. A substrate processing apparatus comprising:

a process chamber configured to provide a reaction space for processing a substrate;

a first electrode installed in the process chamber to face the substrate;

a second electrode positioned beneath the first electrode;

a substrate support installed opposite to the first or second electrode and configured to support the substrate; and an RF power supply configured to supply at least one RF power to at least one of the first and second electrodes, wherein when an inter-electrode distance between the first electrode and the second electrode is out of a set range, the supply of the at least one RF power is stopped, wherein the substrate processing apparatus further comprises:

a measurement unit configured to measure the inter-electrode distance;

a determination unit configured to determine whether the inter-electrode distance is within the set range and to generate an interlock signal when the inter-electrode distance is out of the set range; and a control unit configured to stop the supply of the at least one RF power when the interlock signal is input to the control unit.

7. The substrate processing apparatus according to claim 6, wherein the determination unit generates the interlock signal by determining that the inter-electrode distance is out of the set range when the first and second electrodes are in contact with each other.

\* \* \* \* \*